United States Patent
Furukawa et al.

[11] Patent Number: 5,945,703
[45] Date of Patent: *Aug. 31, 1999

[54] SEMICONDUCTOR MEMORY DEVICE AND MANUFACTURING METHOD THEREFOR

[75] Inventors: Kazuyoshi Furukawa, Kawasaki; Masanobu Ogino, Yokosuka; Koichi Kishi, Fujisawa, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/351,539

[22] Filed: Dec. 7, 1994

[30] Foreign Application Priority Data

Dec. 7, 1993 [JP] Japan .................................. 5-306631

[51] Int. Cl.⁶ .......................... H01L 27/108; H01L 29/76; H01L 29/94; H01L 31/119
[52] U.S. Cl. ............................................. 257/301
[58] Field of Search ............................................. 257/301

[56] References Cited

U.S. PATENT DOCUMENTS 5,332,920  7/1994  Nakagawa et al. .
5,336,912  8/1994  Ohtsuki .................................. 257/301

FOREIGN PATENT DOCUMENTS 3-104163   5/1991  Japan .
4-287366  10/1992  Japan .
6-169069   6/1994  Japan .

OTHER PUBLICATIONS

Database WPAT, Derwent Information Ltd., AN–92–081977/11, JP–4–113377, Apr. 14, 1992. Abstract Only.

Database WPAT, Derwent Information Ltd., AN–88–068031/10, JP–63–022803, Jan. 30, 1988. Abstract Only.

Database WPAT, Derwent Information Ltd., AN–88–289132/41, JP–63–211383, Sep. 2, 1988. Abstract Only.

Database JAPIO, Japan Patent Information Organization, AN–90–203563, JP–2–203563, Aug. 13, 1990.

Database JAPIO, Japan Patent Information Organization, AN–89–237457, JP–1–237457, Sep. 21, 1989.

*Primary Examiner*—Stephen D. Meier
*Attorney, Agent, or Firm*—Oblon, Spivak, McClelland, Maier & Neustadt, P.C.

[57] ABSTRACT

In a semiconductor memory device, a capacitor with a trench having a laterally expanded bottom part is provided, the area above the laterally expanded part being provided for a transistor and cell separation, this resulting in an increase in the degree of integration. This laterally expanded part is formed by etching a silicon oxide film which is sandwiched between a substrate and a silicon layer, and is obtained by forming a depression in a semiconductor substrate beforehand. A silicon layer or another semiconductor substrate is laminated by bonding to a semiconductor substrate such as this into which is formed a depression, a trench which extends to this depression being formed, and the required films being formed to obtain the desired trench capacitor. By forming an oxide film on all of or the depression part of the semiconductor substrate into which is formed the depression, it is possible to eliminate the influence of radiation, by improving insulation properties.

2 Claims, 8 Drawing Sheets

SEMICONDUCTOR MEMORY DEVICE AND MANUFACTURING METHOD THEREFOR

DETAILED DESCRIPTION OF THE INVENTION

Background of the Invention

1. Field of the Invention

The present invention relates to a semiconductor memory device, and in particular to a dynamic random access memory (hereinafter referred to as a DRAM) in which a cell comprises one transistor and one capacitor, and to a manufacturing method therefor.

2. Description of the Background Art

With advances in semiconductor technology, and particularly with advances in microprocess technology, DRAMs in which cells comprise one transistor and one capacitor are undergoing rapid increases in level of integration and capacity. For this reason, trench capacitors, which are formed within trenches dug in the substrate in the depth direction are often used, with the object being the increase of the capacitance obtained on a small surface area.

The prior art trench capacitor will be described below, making reference to FIG. 9. A trench 2 is dug in the capacitor region 10 of the cell on the surface of a p-type silicon substrate 1, with an n-type diffusion layer 3 which serves as the storage node of the capacitor formed on the inner walls of the trench 2. On the surface of this n-type diffusion layer 3 is formed a gate dielectric film 4, and the major part of the trench 2 is filled in with a polycrystalline silicon film 5, which serves as the plate electrode. Materials used as the gate dielectric film 4 included a silicon oxide film, a two-layer film of silicon oxide/silicon nitride, and a three-layer film of silicon oxide/silicon nitride/silicon oxide.

In a trench capacitor cell such as this, the construction is such that it is possible to increase the cell capacitance without increasing the surface area of the cell. However, if the cell surface area is made yet smaller, in order to achieve the same cell volume, it is necessary to dig a yet deeper trench. However, as the trench becomes small and deep, the aspect ratio increases, bringing with it not only the natural difficulty of digging the trench itself, but also a sharp increase in the difficulty of performing processes within the trench to form the capacitor.

SUMMARY OF THE INVENTION

In view of the above, an object of the present invention is to provide a semiconductor memory device which enables a reduction of the memory cell surface area and an increase in the degree of integration, and a manufacturing method therefor.

According to one aspect of the invention, there is provided a semiconductor memory device, comprising a trench capacitor with a laterally expanded bottom part, and a memory cell element in the element region above said laterally expanded trench capacitor.

According to another aspect of the invention, there is provided a semiconductor memory device manufacturing method, comprising the steps of:

laminating a silicon layer together with a semiconductor substrate with an intervening dielectric layer in between;

forming a trench in said silicon layer, said trench extending to at least said dielectric layer;

selectively etching said dielectric layer via said trench to form a laterally expanded part at the bottom of said trench; and forming a capacitor cell inside said trench and inside said laterally expanded part.

According to further aspect of the invention, there is provided a semiconductor memory device manufacturing method, comprising the steps of:

forming an oxide film on one surface of a first semiconductor substrate;

forming a depression which corresponds to an expanded part of a trench in the surface of a second semiconductor substrate;

forming a substrate with an internal void by bonding said oxide film of said first semiconductor substrate and said formed depression surface of said second semiconductor substrate;

forming a trench extending from said second substrate to said void in said first semiconductor substrate; and forming a capacitor cell in said trench and in said void.

According to still further aspect of the present invention, there is provided a semiconductor memory device manufacturing method, comprising the steps of:

preparing a first semiconductor substrate;

forming a depression corresponding to an expanded part of a trench in at least the surface of a second semiconductor substrate;

bonding said first semiconductor substrate and said second semiconductor substrate as one while maintaining their mutual electrical connection to form a substrate having an interval void;

forming a trench in said first semiconductor substrate, said trench extending to said void; and forming a capacitor cell in said trench and in said void.

In a semiconductor memory device according to the present invention, the bottom part of the trench which becomes the capacitor is formed so as to be wider than the top part. This type of configuration is possible by using a bonded substrate, this contributing to an increase in the effective surface area of the capacitor. Using the silicon part positioned at the top of the trench, it is possible to form a layer separating transistors and other elements, this enabling an increase in capacitance of the capacitor, with an increase in neither the cell surface area nor the trench depth, thereby enabling a reduction in the memory cell surface area and an increase in the level of high-density integration.

By using a silicon on insulator (SOI) substrate formed by bonding two wafers together, with an oxide film between them, it is possible not only to achieve a high degree of integration, but also to improve radiation resistance by isolating the capacitor part from the substrate part.

In addition, it is possible to simplify the trench-forming process by using as one of bonded substrates a wafer into which is formed a depression which corresponds to the expanded bottom part of the trench.

DESCRIPTION OF THE PREFERRED EMBODIMENTS

Embodiments of the present invention will be described below, with reference made to the accompanying drawings.

FIGS. 1A to 1F are cross-sectional views which show the individual manufacturing processes for a semiconductor memory device of the first embodiment of the present invention.

Figure 1A:
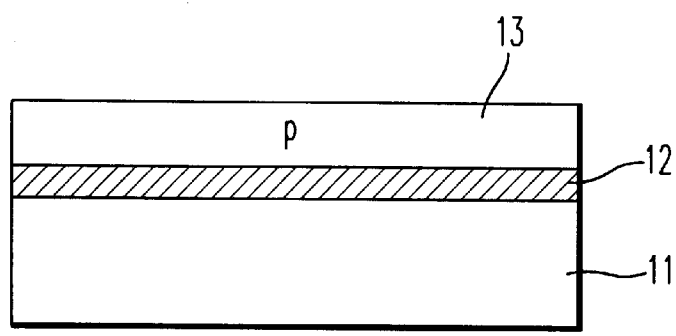
FIGS. 1A to 1F are cross-sectional views of an element which individually show each of the manufacturing processes of the semiconductor memory device of the first embodiment of the present invention.
Figure 1B:
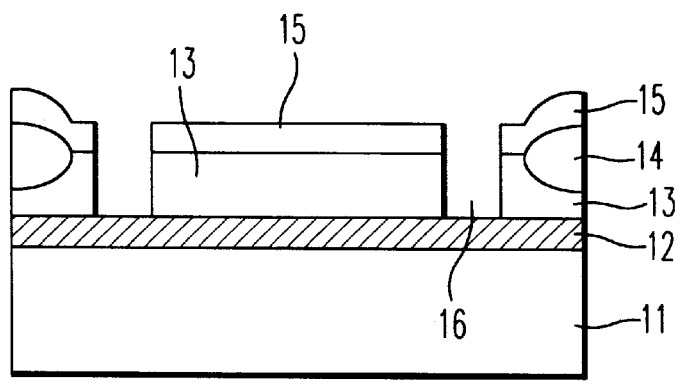
Figure 1C:
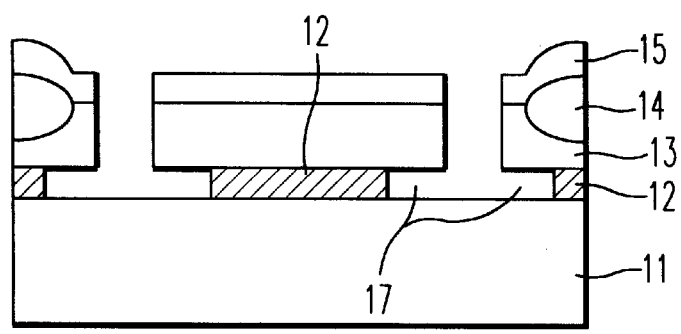
Figure 1D:
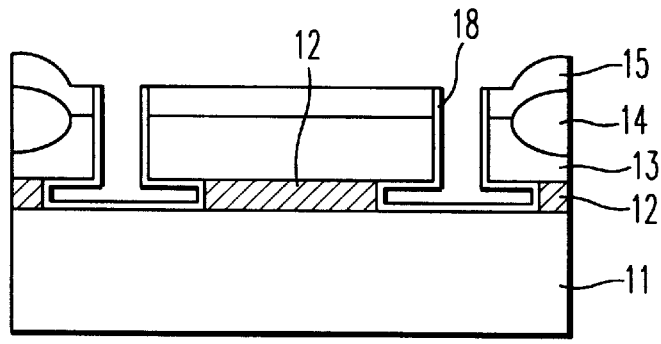
Figure 1E:
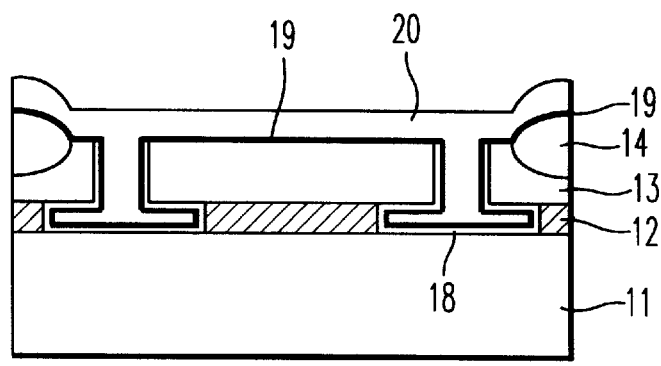
Figure 1F:
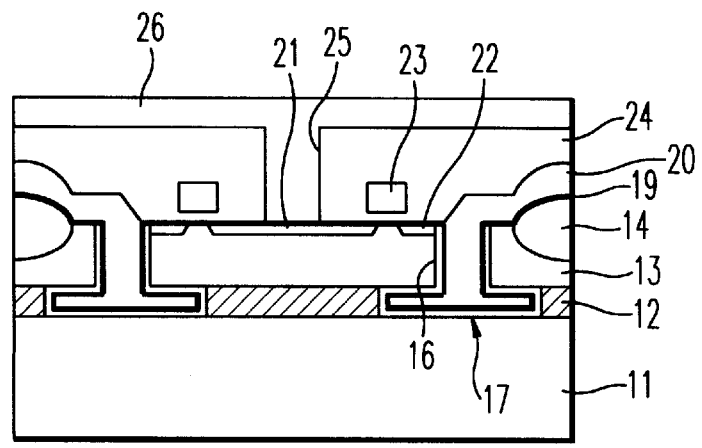

FIG. 1F is a cross-sectional view of an element of the semiconductor memory device according to the present invention, in which an oxide film 12 and a silicon film 13 are laminated on top of a semiconductor substrate 1.

High-impurity-concentration regions 21 and 22 are formed on the top of the silicon film 13, and at the top of the channel which is positioned between these regions is formed a gate electrode 23. In the region adjacent to this transistor a trench 16 is formed, at the bottom part of which within the oxide film 12 is formed a laterally expanded part 17. Inside the trench 16 and the laterally expanded part 17 are formed and laminated a polycrystalline silicon layer 18 which serves as the storage node of the capacitor, a dielectric film 19, and polycrystalline silicon film 20 which serves as the plate electrode.

It can be clearly seen in FIG. 1F that in a memory cell having this type of construction, because the bottom part of the trench capacitor is expanded in the lateral direction, a sufficient volume is achieved without increasing the depth. At the top part of this laterally expanded trench capacitor is provided a transistor and separating region, thereby increasing the degree of integration.

What follows is a description of the manufacturing process for this semiconductor memory device.

First, an silicon oxide film 12 of, for example, 4000 Angstroms, is formed on the supporting substrate (wafer) or the p-type silicon substrate 13, or on both, using the thermal oxidation or CVD (chemical vapor deposition) method, and these two substrates are bonded to one another, with a silicon oxide film therebetween.

The generally used method for performing this direct bonding is as follows. First, a wafer which is polished to a mirror finish is cleansed and its surface is activated. In the cleansing process it is possible to use inorganic acids such as sulfuric acid, hydrochloric acid, nitric acid, hydrogen peroxide, and compounds thereof. or alkaline chemicals such as ammonia or amines. It is also possible to use combination of these chemicals.

Next, after cleansing the wafer is dried in, for example, a spin dryer, after which the surfaces which are to be bonded to one another are placed in intimate contact. When doing this, it is necessary to perform the operation in a clean atmosphere to prevent the intrusion of impurities between the wafers. In bringing the surfaces into contact with each other, because the surface is activated, the wafers come into intimate contact by themselves, it not being necessary to apply mechanical force. While this bonding process can be performed in an atmosphere at room temperature, it is possible after bonding to improve the bonding strength by heat treating, thereby making it possible to completely form as one the two wafers. While an improvement in strength is observed at a temperature of above 200° C., to obtain the maximum mechanical strength it is desirable to have a temperature of 900° C. or above, or preferably 1100° C. or above. The heat treating can be done in an atmosphere of oxygen, hydrogen, nitrogen, or steam, or a mixed gas thereof, with nitrogen that includes some oxygen being commonly used.

In this embodiment, cleansing and activation are performed using a mixed liquid of sulfuric acid and hydrogen peroxide, and to prevent nitriding of the silicon surface, heat treating is done for 1 hour at 1100° C. in a nitrogen atmosphere which includes 2% oxygen.

Next, a p-type silicon substrate 13 is polished until the entire substrate is of a thickness of, for example, 1 μm. It is also possible to use etching to make the silicon substrate 1 thin, and selective etching can also be used. It is possible, for example, to use the method of burying a high-impurity concentration p-type layer into the surface of the silicon substrate 1 to the prescribed depth from the surface beforehand, and then to perform selective etching up to that part after bonding, thereby enabling highly precise control of the semiconductor substrate thickness. The above processes achieve the construction shown in FIG. 1A.

Next, selective oxidation by a method such as LOCOS (local oxidation of silicon) is used to form the required element isolation region 14 on top of the p-type single-crystal silicon substrate 13 to a thickness of, for example, 4000 Angstroms, after which an overall silicon nitride film 15 is formed to a thickness of, for example, 1000 Angstroms, by the CVD method, and photoetching and RIE (reactive ion etching) are used to form a trench 16, which passes through the silicon nitride film 15 and the p-type single-crystal silicon substrate 13 (refer to FIG. 1B).

Next, an ammonium fluoride solution is used to selectively etch the silicon oxide film 12. By doing this, trench 17 expands in the lateral direction, that is, trench 17 expands circularly about trench 16 within the silicon oxide film 12 as a center (refer to FIG. 1C).

Next, polycrystalline silicon 18, which is doped with arsenic and serves as the storage node of the capacitor, is deposited to a thickness of, for example, 1000 Angstroms, after which the inside of the trench is filled with resist and dry etching is performed in this protected condition, which removes the polycrystalline silicon 18 which is exists in a planar form on the top of the silicon nitride film 15, so that a condition in which the polycrystalline silicon film 18 exist on the inner walls of the trench, as shown in FIG. 1D, is achieved.

Next, the silicon nitride film 15 is removed by means of wet etching, after which a silicon nitride film 19, which serves as the dielectric film of the capacitor, is deposited to a thickness of, for example 80 Angstroms, using the CVD method, further after which a silicon oxide film (not shown in the drawing) is formed to thickness of, for example, 20 Angstroms, on the surface of the silicon nitride film 19, by means of thermal oxidation. Then polycrystalline silicon 20, which is doped with phosphor and which serves as the plate electrode of the capacitor, is deposited to a thickness, for example, of 2000 Angstroms, using the CVD method (refer to FIG. 1E).

Next, after application of photoresist, photoetching is used to perform patterning so that photoresist in the element region is removed, the remaining photoresist being used as a mask for reactive ion etching which is done to remove the polycrystalline silicon 20. After forming on the exposed substrate the n-type diffusion layers 21 and 22 which serve as the source and drain, and the gate electrode 23 of the transistor, the layer-insulating film 24 is deposited. This inter layer insulating film 24 is provided with a contact hole 25, which extends to the n-type diffusion layer 21, an aluminum film being vapor deposited to fill the contact hole 25, and patterning being done to make the bit line 26 (refer to FIG. 1F).

While in the abovedescribed embodiment the polycrystalline silicon 18 which serves as the storage node is directly deposited on the walls of the trench 3, it is also possible to deposit an oxide film using the CVD method before depositing this polycrystalline silicon 18, thereby providing an oxide film between the storage node and the trench walls. It is also possible in reverse to use the walls of the trench as the storage node, therein eliminating the polysilicon.

Also, while in the above-described embodiment a substrate in which silicon wafers are directly bonded with an oxide film in between is used, it is also possible to have an embodiment in which a silicon film is provided on the top of an insulator such as sapphire to form, for example, an SOI (silicon on sapphire) substrate. Additionally, it is also possible to use a substance other than an oxide film for the dielectric, as long as the substance can be etched selectively with respect to silicon.

In addition, it is also possible to use a substrate formed by a high-impurity concentration silicon layer sandwiched in between low-impurity concentration silicon layers, and to selectively etch the high-impurity concentration silicon layer. For example, it is possible to use epitaxial growth or bonding to make a sandwich-configured substrate, and to selectively etch the high-impurity-concentration silicon layer using a liquid consisting of a mixture of hydrofluoric acid, nitric acid, and acetic acid in the ratio of 1:3:8.

While the above-described first embodiment of the present invention enables the achievement of a high degree of integration, because the bottom part of the trench is expanded by etching, it is difficult to control the expanding at the bottom part with high precision, and because this expanding at the bottom part is in a circular form about the trench as the center, it is difficult to adjust this to other pattern features which are in general rectangular, so that this does not necessarily bring about the effect of a high degree of integration.

The second embodiment of the present invention is for the purpose of solving the above type of problems, and will be described below, with reference being made to FIGS. 2A to 2E.

Figure 2A:
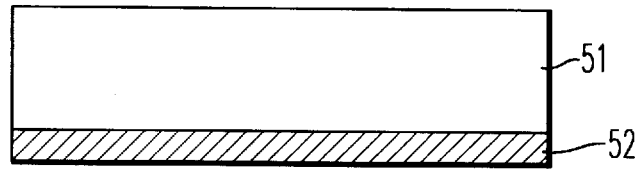
FIGS. 2A to 2E are cross-sectional views of an element which individually show each of the manufacturing processes of the semiconductor memory device of the second embodiment of the present invention.
Figure 2B:
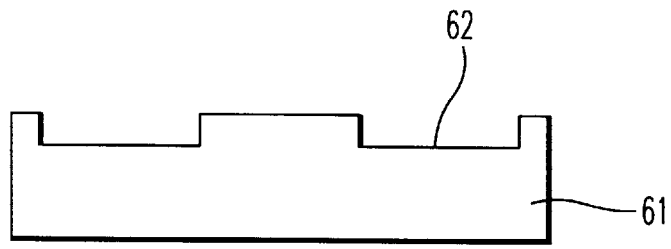
Figure 2C:
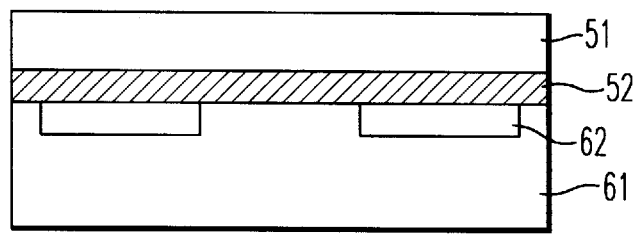
Figure 2D:
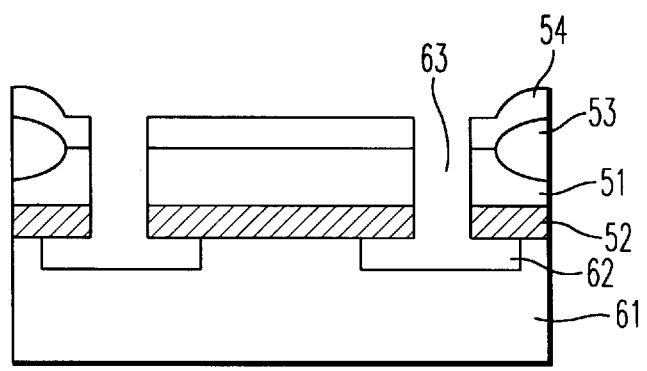
Figure 2E:
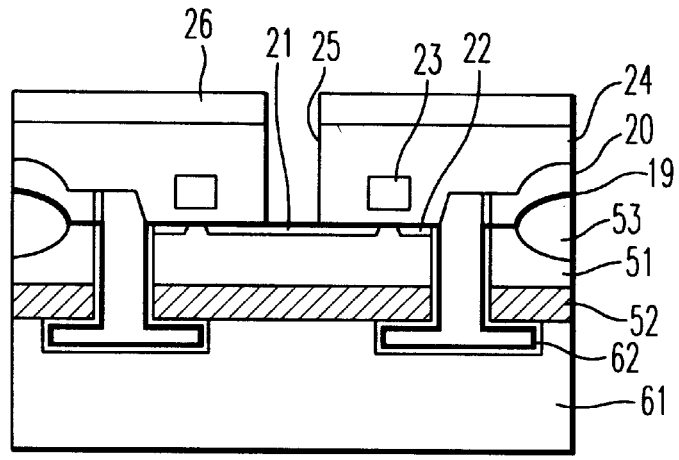

FIG. 2E is a cross-sectional view of an element which shows a semiconductor memory device according to the second embodiment of the present invention in its completed condition. This is similar to FIG. 1F, with the difference being that the laterally expanded part 62 at the bottom part of the trench is formed beforehand in the substrate in a rectangular shape.

By doing this, it is possible to reliably achieve a laterally expanded part of the desired shape and dimensions, thereby improving yield and reliability.

The manufacturing method for this embodiment is described below.

One side of a p-type silicon substrate 51 is oxidized, thereby forming an oxide film 52 (FIG. 2A).

Next, a depression 62, which will be the region that will be the bottom of the expanded trench is formed on a silicon wafer 61, which will serve as a supporting substrate. (FIG. 2B). This depression 62 can be formed with good precision by using, for example, a combination of photoresist patterning by photoetching, anisotropic etching such as RIE, and wet etching such as done with hydrofluoric/nitric acid or alkaline solutions. The shape of depression 62 viewed from the top is rectangular.

Next, after directly bonding the oxide film 52 surface of the substrate 51 to the surface of the supporting substrate 61 that has the depression 62, polishing or some other means is used to reduce the thickness of the substrate 51, to obtain an SOI substrate which has a void 33 which becomes the bottom of the trench beneath the oxide film 7 (FIG. 2C). Although when performing this bonding, because the depression is not open to the outside, there might be a problem when performing heat treating caused by thermal expansion of the air which is trapped in the depression, in this embodiment because the amount of surface area occupied by the depression with respect to the bonded surface area is small and also because the depression is shallow, the amount of trapped air is small, so that this presents no particular problem. In the case in which the internal gas makes bonding difficult, by performing the bonding of the wafers at room temperature in an atmosphere that contains a large amount of oxygen, this oxygen is used up in oxidation of the inner walls of the resulting void when performing bonding heat treating, thereby reducing the problem of thermal expansion of the internal gas.

Next, selective oxidizing is performed using a method such as the LOCOS method, to form the required element isolation region 53 to, for example, a thickness of 4000 Angstroms on the top of the p-type single-crystal silicon substrate 52, after which a silicon nitride film 54 is deposited overall to a thickness of, for example, 1000 Angstroms, using the CVD method, photoetching and RIE being used to dig a trench 63 in the desired trench formation position reaching to at least the void 62 (FIG. 2D).

After this, the same type of processes as in FIG. 1D, FIG. 1E, and FIG. 1F are used to obtain a memory cell as shown in FIG. 2E. In FIG. 2E, with regard to the constitutional elements formed after the silicon nitride film 54 is removed, the same reference symbols as used in FIGS. 1D to 1F have been applied, and these will not be described in detail herein.

The third embodiment of the present invention will be described below, with reference being made to FIGS. 3A to 3D.

Figure 3A:
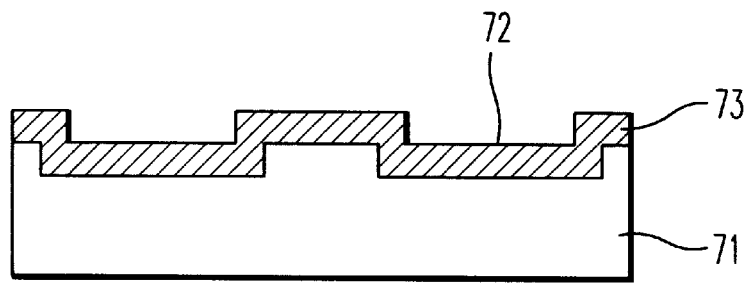
FIGS. 3A to 3D are cross-sectional views of an element which individually show each of the manufacturing processes of the semiconductor memory device of the third embodiment of the present invention.
Figure 3B:
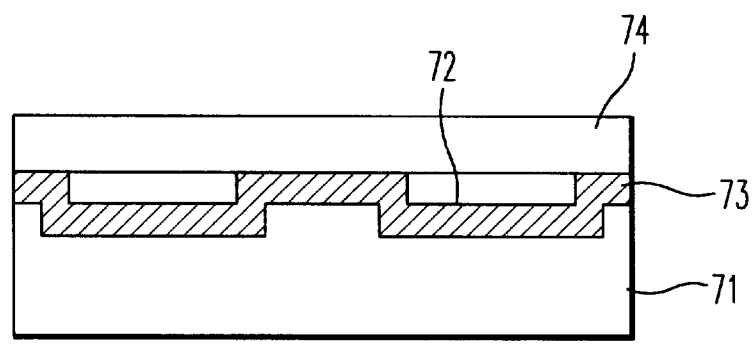
Figure 3C:
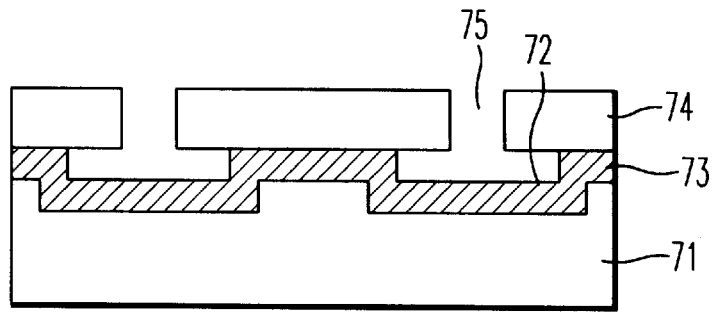
Figure 3D:
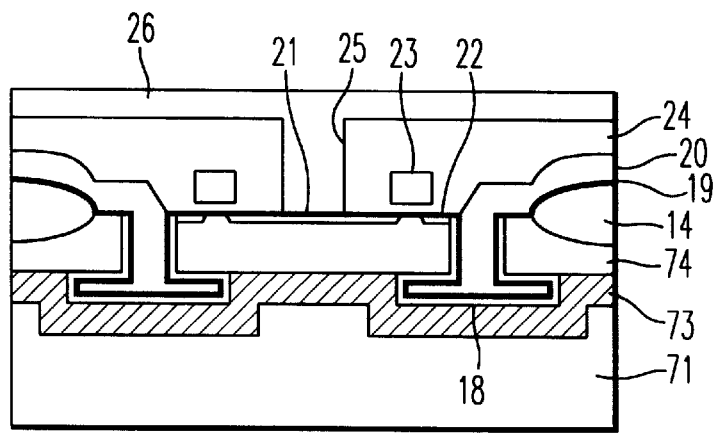

The semiconductor memory device shown in FIG. 3D is the same as the embodiment shown in FIG. 2E to the extent that a laterally expanded part at the bottom part of the trench is formed using a depression formed beforehand in the semiconductor substrate, but in this case, it is different from that of FIG. 2E in that there is an oxide film 73 which is formed on the surface of the semiconductor substrate 73 which includes the depression.

In a memory cell according to this third embodiment, the trench capacitor is completely dielectrically separated from the supporting substrate 71. For this reason, electrical charges which occur in the substrate because of radiation such as g rays which pass through it do not reach the capacitor, so that the immunity to what are known as soft errors is good. This enables the achievement of a semiconductor memory device with a high degree of integration and good radiation hardness. The manufacturing method for this embodiment is described below.

A depression 72 is formed in the surface of silicon wafer 71 in the region which will become the expanded trench bottom, and then the substrate surface and inner surface of the depression are oxidized to form the oxide film 73 (FIG. 3A).

Next, after performing bonding of a different silicon wafer 74 directly onto silicon wafer 71, the thickness of wafer 74 is reduced, and an SOI substrate is obtained which has a void 72 which will serve as the trench bottom on the top of the oxide film 73.

Next, trench 75 is dug so that it extends at least to the void 72 (FIG. 3C).

After this, processes similar to those of FIGS. 1D to 1F are used to obtain the semiconductor memory cell shown in FIG. 3E. In FIG. 3E, the constitutional elements formed after removal of the silicon nitride film 54 are assigned symbols the same as in FIGS. 1D to 1F, and will not be described in detail herein.

Figure 4:
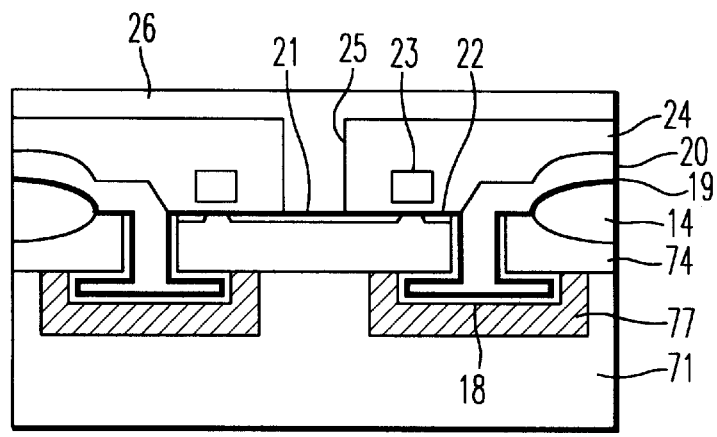
FIG. 4 is a cross-sectional view of an element which shows a step of a process for a semiconductor memory device of the fourth embodiment of the present invention.

FIG. 4 is a crosssectional view of a semiconductor memory device according to the fourth embodiment of the present invention. In this memory cell, in the process shown in FIG. 3A for the third embodiment of the present invention, after forming depression 72, to serve as the expanded trench bottom, in the surface of silicon wafer 72, which will serve as the supporting substrate, the inside only of this depression is selectively oxidized to provide on it oxide film 7, after which bonding and element forming process are the same as in FIG. 3C.

This selective oxidizing can be done by providing an overall oxide film on the entire substrate 10, and then removing the part of the oxide film on the depression part.

A characteristic of this fourth embodiment of the present invention is that the silicon part in which a transistor is formed is electrically connected to the substrate 10. While in the previously described third embodiment, the transistor is dielectrically separated from the substrate, and is in the floating condition, leading to the possibility of problems with regard to characteristics, in this fourth embodiment no such problems occur.

Figure 5:
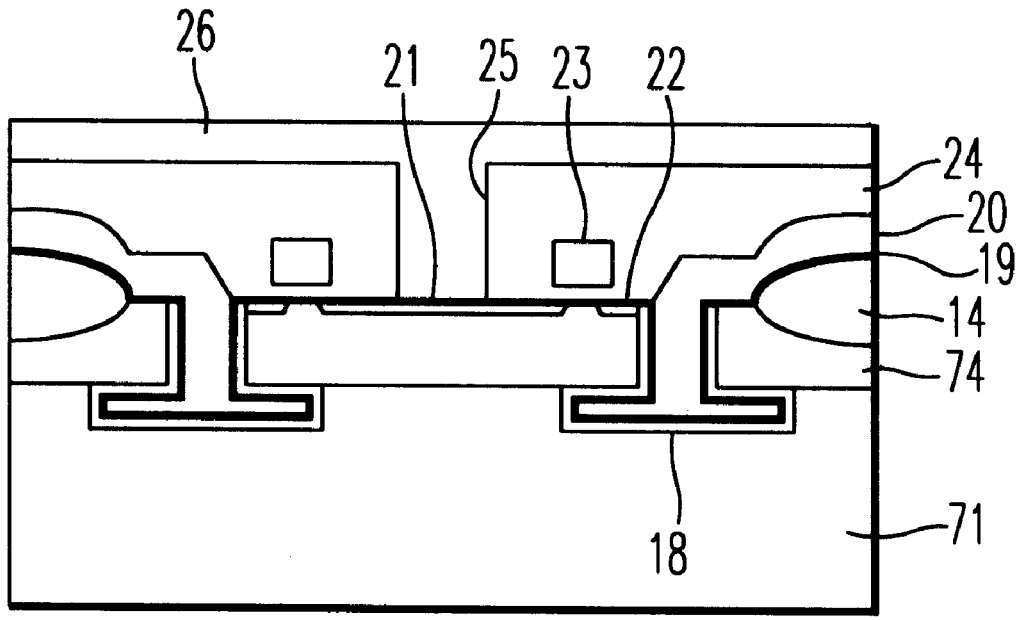
FIG. 5 is a cross-sectional view of an element which shows a step of a process for a semiconductor memory device of the fifth embodiment of the present invention.
Figure 6:
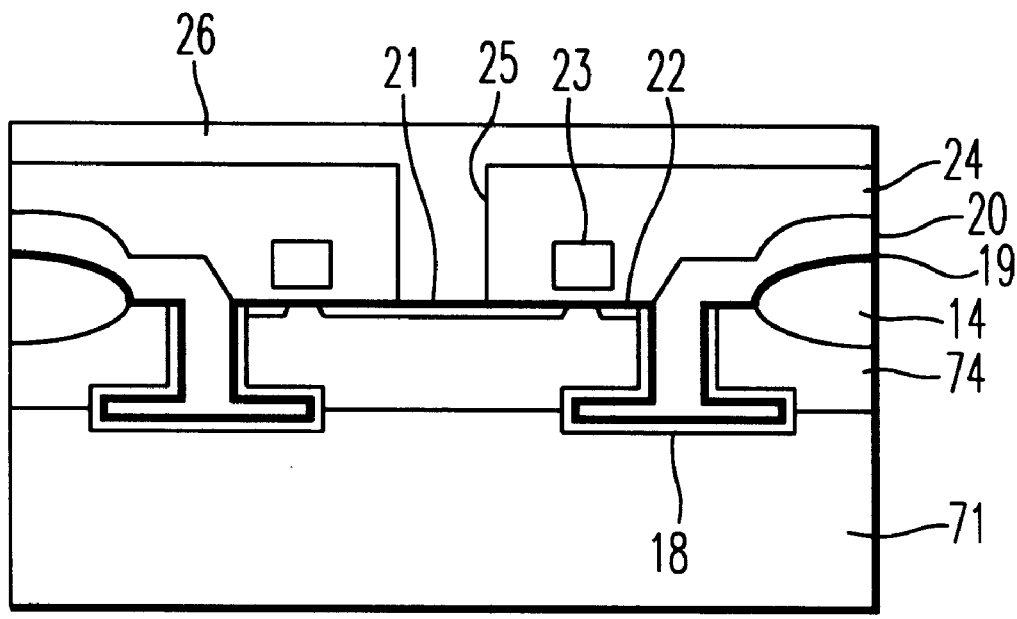
FIG. 6 is a cross-sectional view of an element which shows a step of a process for a semiconductor memory device of the sixth embodiment of the present invention.
Figure 7A:
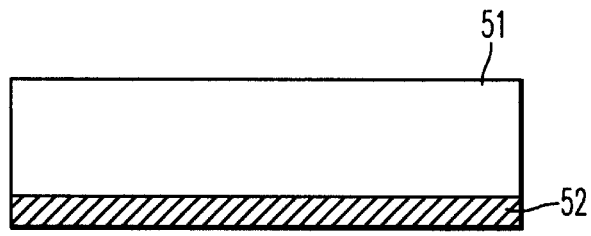
FIGS. 7A to 7E are cross-sectional views which show the individual manufacturing processes for a semiconductor memory device of the seventh embodiment of the present invention.
Figure 7B:
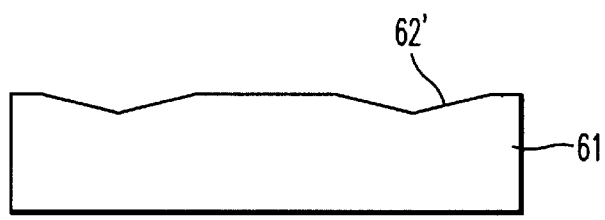
Figure 7C:
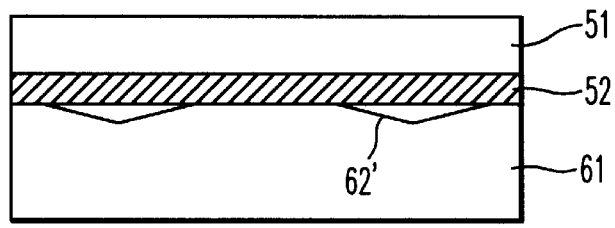
Figure 7D:
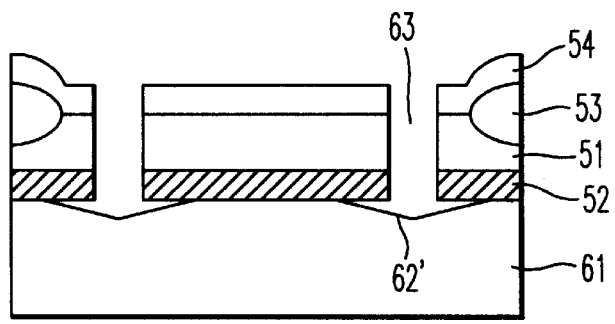
Figure 7E:
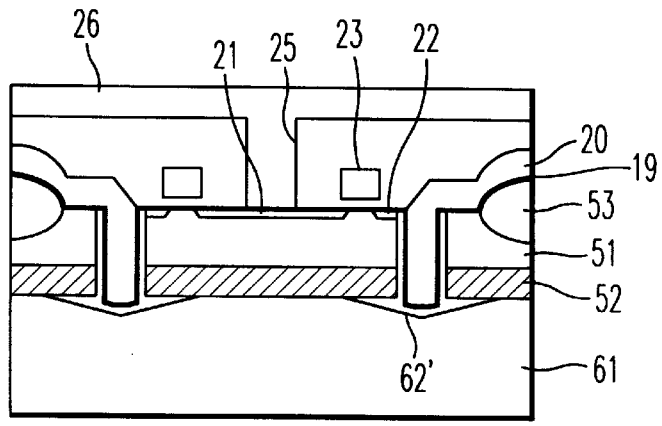

FIG. 5 shows a fifth embodiment of the present invention, and FIG. 6 shows a sixth embodiment of the present invention. These embodiments are manufactured by using the method of bonding together two substrates in which an expanded part of the trench bottom as shown, for example in FIG. 2E, FIG. 3C, and FIG. 6, is formed beforehand, and then forming the trench, but are different in that they do not use an intervening silicon oxide film. That is, in FIG. 5, the part corresponding to the expanded bottom part of the trench is provided beforehand in the supporting substrate, the trench and cell being formed after bonding the silicon substrate to this.

In FIG. 6, expanded trench parts are formed in corresponding locations of both the supporting substrate and the silicon wafer which is bonded to it, after which the trench and cell are formed.

In these embodiments, because the two wafers are bonded to one another without an intervening oxide film, it is not necessary to consider stresses caused by the difference in thermal expansion between silicon and the oxide film, thereby providing the advantage of enabling the use of previous semiconductor manufacturing processes and conditions as is.

FIGS. 7A to 7E show the seventh embodiment of the present invention. These figures are different from FIGS. 2A to 2E only for the cross sectional shape of depression 62'. That is, the bottom of the depression 62' is composed of inclined planes with the center of the depression being the deepest.

Such structure can be obtained by employing an anisotropic etching method using differences of etching rates along crystal orientations This embodiment is advantageous in that possibility of plugging which tends to occur when filling polycrystalline silicon in the laterally expanded part in the case of consant depth depression 62 can be lowered.

Figure 8:
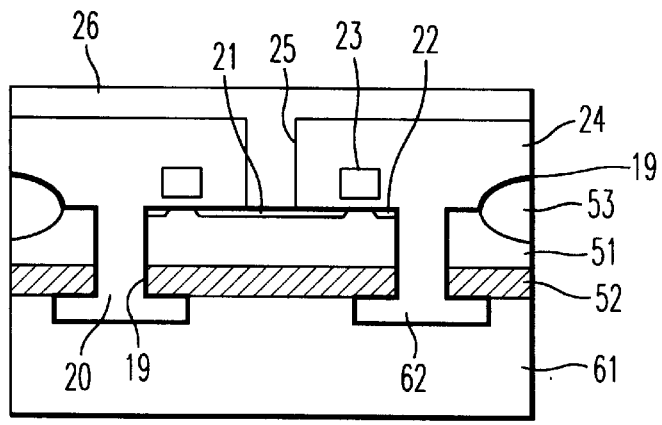
FIG. 8 is a cross sectional view which shows a step of a process for a semiconductor memory device of the eighth embodiment of the present invention.
Figure 9:
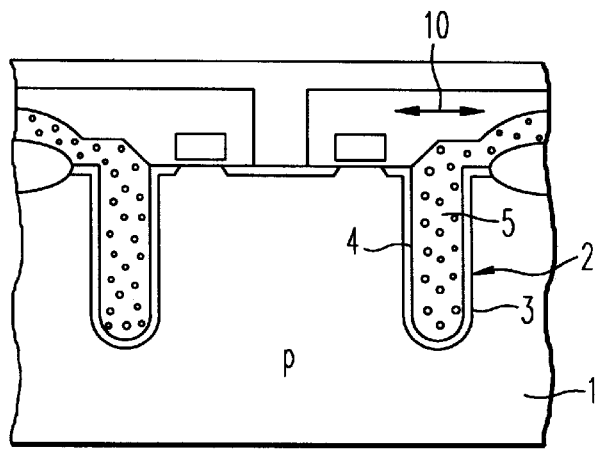
FIG. 9 is an elemental cross-sectional view which shows a semiconductor memory device of the prior art.

FIG. 8 shows the eighth embodiment of the present invention, which illustrates the surfaces of the trench 63 and of the laterally expanded part 62 are covered by direct oxidation film 19.

This embodiment employs direct oxidation at surfaces of the trench 63 and the laterally expanded part 62. Such exidation can be made at the same time of the oxidation of the field oxide film 14.

The structure shown in FIG. 8 is advantageous that since the thermal oxidation film 19 has a good quality as dielectric film that the whole substrate 61 can be used as the plate electrode.

The above has been the description of a number of embodiments, and it is also possible to employ combinations thereof. For example, it is possible to form depression in two substrates. It is also possible to form a capacitor in a depression first and then perform the bonding. Although the only method of cell separation illustrated is LOCOS, it is possible to use a different method. In particular when using an SOI substrate, it is possible to make effective use of trench separation or mesa separation.

According to the present invention as described above, it is possible to form a trench capacitor with a expanded bottom part, the area above the expanded part being usable to form and separate cells. As a result, it is possible to provide a semiconductor memory device having a memory cell enabling a high degree of integration.

What is claimed is:

1. A semiconductor memory device comprising:

a first semiconductor substrate;

an insulation layer disposed on said first semiconductor substrate, said insulation layer having a first trench which has a first lateral dimension; and a second semiconductor substrate disposed on said insulation layer, said second semiconductor substrate having a second trench which has a second lateral dimension which is smaller than the first lateral dimension, wherein inner walls of said first and second trenches are covered by a dielectric film and an inner space formed by the trenches is filled with conductive material to form a capacitor for storing data.

2. The semiconductor memory device according to claim 1, wherein said first and second semiconductor substrates are bonded together and said insulation layer is provided on at least either of a top surface of the first semiconductor substrate or a bottom surface or the second semiconductor substrate.

* * * * *